(12) United States Patent
Lin

(10) Patent No.: US 8,362,831 B2
(45) Date of Patent: Jan. 29, 2013

(54) REFERENCE VOLTAGE BUFFER AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 74 days.

(21) Appl. No.: 12/955,019

(22) Filed: Nov. 29, 2010

(65) Prior Publication Data

US 2012/0133439 A1  May 31, 2012

(51) Int. Cl.
  *H03F 1/20* (2006.01)
  *H03F 1/14* (2006.01)
(52) U.S. Cl. .............................. 330/9; 330/51
(58) Field of Classification Search ............. 330/9, 51, 330/307
See application file for complete search history.

(56) References Cited

U.S. PATENT DOCUMENTS

| 5,338,977 | A | * | 8/1994 | Carobolante | 327/110 |
| 5,854,574 | A | * | 12/1998 | Singer et al. | 330/293 |
| 6,215,353 | B1 | * | 4/2001 | Lewyn | 327/538 |
| 7,215,205 | B2 | * | 5/2007 | Kitlinski et al. | 330/307 |
| 7,280,064 | B2 |   | 10/2007 | Lin |  |

* cited by examiner

*Primary Examiner* — Robert Pascal
*Assistant Examiner* — Khiem Nguyen
(74) *Attorney, Agent, or Firm* — McClure, Qualey & Rodack, LLP

(57) ABSTRACT

An apparatus comprises: an OTA (operational trans-conductance amplifier) with a positive input terminal coupled to a reference voltage, a negative input terminal coupled to a feedback node, and an output terminal shunt to a ground node via a shunt capacitor; a resistor coupling the output terminal of the OTA to the feedback node; and a load circuit coupled to the feedback node via a switch controlled by a logical signal, wherein: an impedance of the shunt capacitor is substantially smaller than an input impedance of the load circuit. In an embodiment, the load circuit is a switch capacitor circuit. A corresponding method using an OTA is also provided.

20 Claims, 2 Drawing Sheets

REFERENCE VOLTAGE BUFFER AND METHOD THEREOF

BACKGROUND OF THE INVENTION

1. Field of the Invention

The present invention generally relates to reference voltage buffers, and more particularly to low-power, fast-reacting reference voltage buffers.

2. Description of Related Art

Reference voltage buffers are needed in numerous applications, e.g. pipeline ADC (analog-to-digital converter). The principles (e.g., structure and operation) of pipeline ADCs are well known in prior art and thus need not be described herein. For example, an illustrative pipelined ADC is described in U.S. Pat. No. 7,280,064. As described in U.S. Pat. No. 7,280,064, a pipeline ADC comprises a plurality of pipeline stages. A typical 1-bit pipeline stage 100 is depicted in FIG. 1. Pipeline stage 100 receives an input signal $V_I$ and generates an output signal $V_O$ and a 1-bit decision D. Pipeline stage 100 operates in accordance with a two-phase non-overlapping clock comprising a sampling phase $\Phi_1$ and a transfer phase $\Phi_2$. During the sampling phase (i.e., $\Phi_1$ is logically 1 and $\Phi_2$ is logically 0), the input signal is sampled into a first capacitor $C_1$ and a second capacitor $C_2$ via a first switch 125 and a second switch 121, respectively, where a termination to ground is provided for $C_1$ and $C_2$ by coupling the circuit node 150 to ground via a third switch 131. In the meantime, a polarity of the input signal $V_I$ is detected using a comparator 103, resulting in an intermediate signal S, and the 1-bit decision D is made by latching the intermediate signal S using a latch 105.

The pipeline stage 100 further comprises an operational amplifier 101, with a positive input terminal coupled to ground, a negative input terminal coupled to circuit node 150, and an output node 160 coupled to a third capacitor $C_3$ to generate the output signal $V_O$. During the transfer phase (i.e., $\Phi_2$ is logically 1 and $\Phi_1$ is logically 0), the second capacitor $C_2$ effectively forms a negative feedback capacitor coupling between the negative input terminal and the output node 160 of the operational amplifier 101 via a fourth switch 123. In the meantime, a first logical signal EN_P is generated by performing an AND operation on the 1-bit decision D and the transfer phase clock $\Phi_2$ using a first AND gate 107, and a second logical signal EN_N is generated by performing an AND operation on DB (which is a logical inversion of the 1-bit decision D generated by an inverter 111) and the transfer phase clock $\Phi_2$. A first reference voltage VRP is coupled to the first capacitor $C_1$ via a fifth switch 127 if the first logical signal EN_P is logically 1. A second reference voltage VRN is coupled to the first capacitor $C_1$ via a sixth switch 129 if the second logical signal EN_N is logically 1. That is, during the transfer phase, the first capacitor $C_1$ is coupled to VRP if the 1-bit decision D is 1, and coupled to VRN otherwise.

FIG. 2 depicts a typical circuit 200 for generating the two reference voltages VRP and VRN. Circuit 200 comprises: a current source IB, two resistors R1 and R2, two unity gain buffers 210 and 220, and two capacitors $C_P$ and $C_N$. Throughout this disclosure VDD denotes a substantially fixed output voltage from a power supply. The current source IB along with the two resistors R1 and R2 determine two substantially fixed voltages VRP0 and VRN0. The two unity gain buffers 210 and 220 are embodied by two operational trans-conductance amplifiers (OTA) 211 and 221, respectively, configured in a non-inverting feedback topology. The two unity gain buffers are terminated with the two capacitors $C_P$ and $C_N$, respectively, resulting in the two reference voltages VRP and VRN, respectively. In order for the reference voltages VRP and VRN to better hold their respective values upon a change of state of the switch capacitor 100 of FIG. 1, the two capacitors $C_P$ and $C_N$ must be much larger than the first capacitor $C_1$ of FIG. 1.

Referring collectively to both FIG. 1 and FIG. 2, when the first logical signal EN_P is asserted, a charge is drawn from $C_P$ to $C_1$, and the charge must be supplied by OTA 211 in order to maintain a constant level of the first reference voltage VRP. When the second logical signal EN_N is asserted, on the other hand, a charge is drawn from $C_1$ to $C_N$, and the charge must be absorbed by OTA 221 in order to maintain a constant level of the second reference voltage VRN. In order to quickly supply (absorb) the charge to make VRP (VRN) substantially constant, OTA 211 (221) must be a high-speed circuit. As is known, higher speed circuits typically consume more power.

Accordingly, what is desired is fast reacting buffer circuit to make a reference voltage substantially constant without consuming an excessive amount of power.

BRIEF SUMMARY OF THE INVENTION

In an embodiment, an apparatus comprises: an OTA (operational trans-conductance amplifier) with a positive input terminal coupled to a reference voltage, a negative input terminal coupled to a feedback node, and an output terminal shunt to a ground node via a shunt capacitor; a resistor coupling the output terminal of the OTA to the feedback node; and a load circuit coupled to the feedback node via a switch controlled by a logical signal, wherein: an impedance of the shunt capacitor is substantially smaller than an input impedance of the load circuit. In an embodiment, the load circuit is a switch capacitor circuit. In an embodiment, a first current flowing through the resistor leads to a voltage difference between the output terminal of the OTA and the feedback node, and the voltage difference leads to a feedback from the feedback node via the negative input terminal of the OTA causing the OTA to output a second current to the shunt capacitor such that the second current is approximately equal to the first current.

In another embodiment, a method comprises: using an OTA (operational trans-conductance amplifier) to output a first current to a shunt capacitor, wherein the first current is proportional to a voltage difference between a reference node and a feedback node; coupling the feedback node to a load circuit via a switch controlled by a logical signal; and coupling the shunt capacitor to the feedback node via a resistor such that a second current flowing through the resistor is approximately equal to the first current. In an embodiment, the load circuit is a switch capacitor circuit. In an embodiment, a positive terminal of the OTA is coupled to the reference node, a negative terminal of the OTA is coupled to the feedback node, and an output terminal of the OTA is coupled to the shunt capacitor.

DETAILED DESCRIPTION OF THIS INVENTION

The present invention relates to a reference voltage buffer, in particular to reference voltage buffer for switch-capacitor circuits. While the specifications described several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 3:
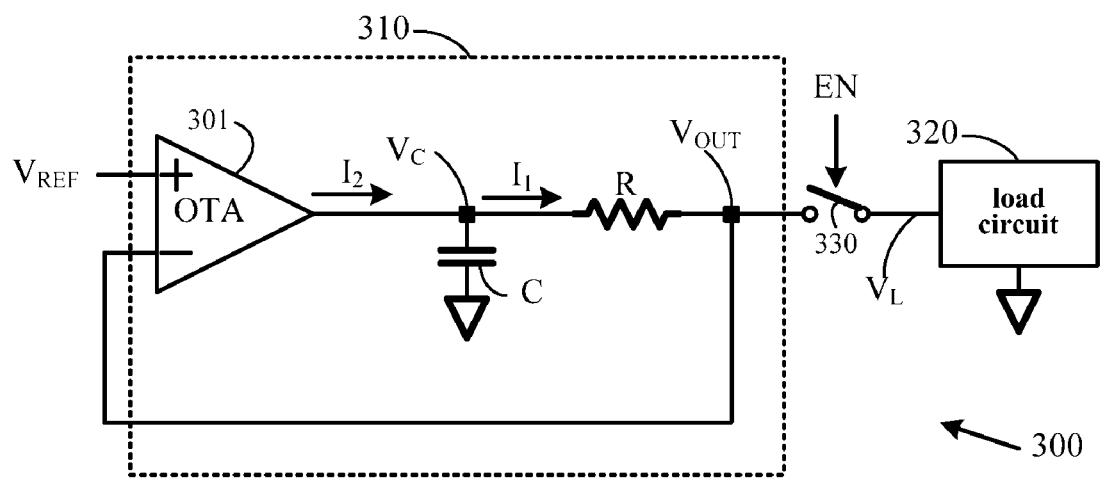
FIG. 3 shows a schematic diagram of a reference voltage buffer circuit of an embodiment in accordance with the present invention.

An exemplary circuit 300, constructed in accordance with an embodiment of the present invention, is depicted in FIG. 3. Circuit 300 comprises: a reference voltage buffer 310 for receiving a reference voltage $V_{REF}$ and outputting an output voltage $V_{OUT}$, a switch 330 controlled by a logical signal EN, and a load circuit 320 coupled to the output voltage via the switch 330. The switch 330 is closed when the logical signal EN is asserted, i.e. set to logical 1, and open otherwise. The buffer circuit 310 comprises: an OTA (operational trans-conductance amplifier) 301 with a "+" input terminal coupled to the reference voltage $V_{REF}$, a "−" terminal coupled to the output voltage $V_{OUT}$, and an output terminal coupled to a shunt capacitor C resulting in an intermediate voltage $V_C$, and a resistor R coupling the intermediate voltage $V_C$ to the output voltage $V_{OUT}$. The shunt capacitor C has a large capacitance so that an impedance of the shunt capacitor C is substantially smaller than an input impedance of the load circuit 320.

As described earlier, when the logical signal EN is asserted, the output voltage $V_{OUT}$ is coupled to the load circuit 320 via the switch 330. Upon the assertion of the logical signal EN: if the voltage $V_L$ at the load circuit 320 is lower (higher) than the output voltage $V_{OUT}$, a charge must be drawn from the shunt capacitor C (load circuit 320) to the load circuit 320 (shunt capacitor C), resulting in a positive (negative) value of a first current $I_1$. Since the impedance of the shunt capacitor C is substantially smaller than the input impedance of the load circuit 320, the intermediate voltage $V_C$ only drops (rises) slightly. However, the first current $I_1$ may lead to a much greater voltage drop (rise) at the output voltage $V_{OUT}$, as long as a resistance of the resistor R is appreciable. The negative feedback configuration of the OTA 301 causes the OTA 301 to supply (drain) charge to (from) the shunt capacitor $C_L$, resulting in a positive (negative) value of a second current $I_2$ to compensate for the charge loss (gain) of the shunt capacitor $C_L$ due to the positive (negative) value of the second current $I_2$. By carefully choosing a value of the resistor R, the second current $I_2$ approximately offsets the first current $I_1$.

Figure 1:
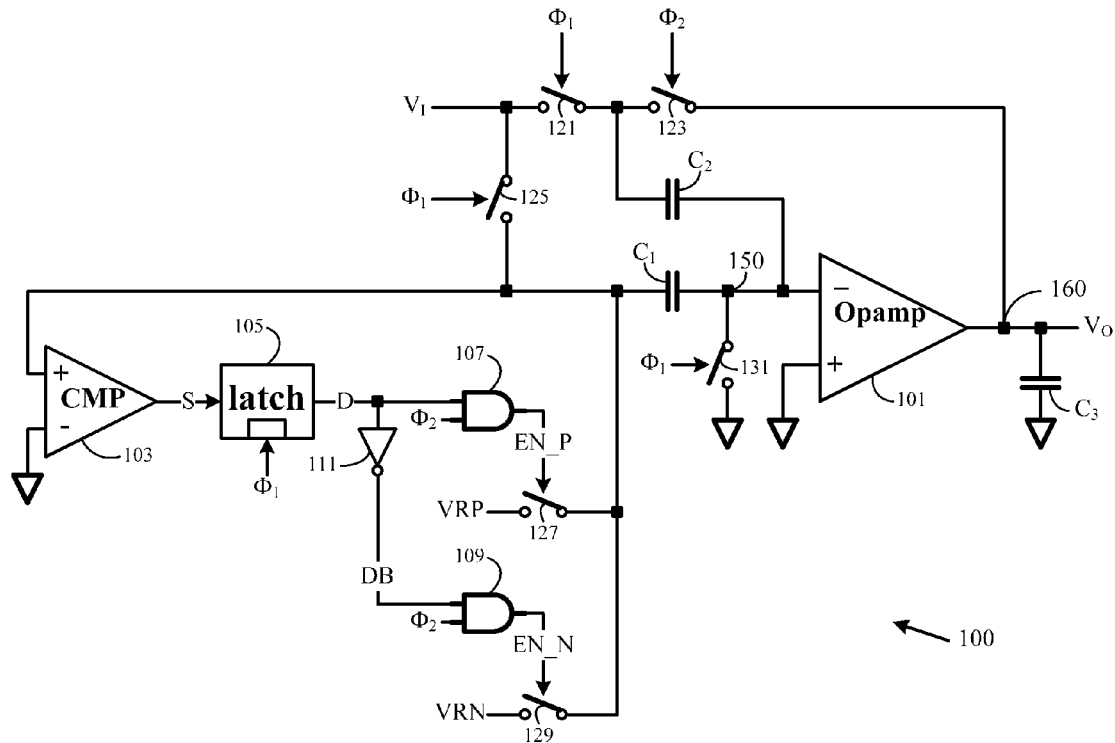
FIG. 1 shows a schematic diagram of a 1-bit pipeline stage for a prior art pipeline ADC.
Figure 2:
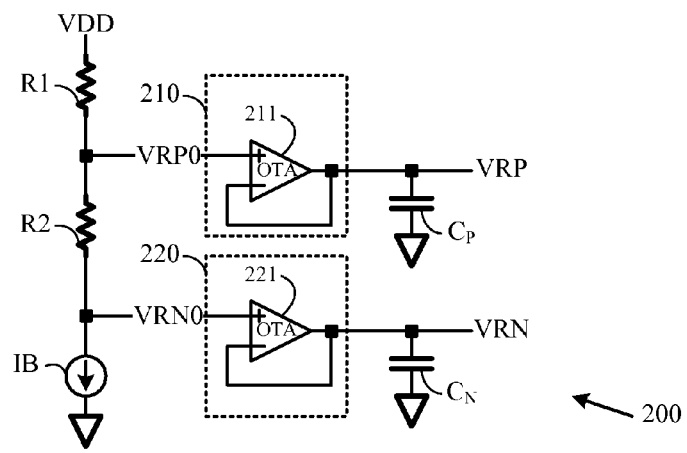
FIG. 2 shows a prior art reference voltage buffer circuit.

In the prior art 200 depicted in FIG. 2, the voltage difference between the "+" and "−" terminals of the operational OTA 211 (221) is very small due to using large capacitors $C_P$ and $C_N$ to better hold the voltage, and therefore OTA 211 (221) act slowly unless one chooses to use a very large transconductance for OTA 211 (221) at the cost of high power consumption. In this present invention embodied by circuit 300 of FIG. 3, however, the voltage difference between the "+" and "−" terminals of the operational OTA 301 can be much greater due to the extra voltage drop (rise) on the resistor R resulting from the first current $I_1$; this allows the OTA 301 to act fast to output the second current $I_2$ without using a very large transconductance. Therefore, circuit 300 of FIG. 3 can either act much faster than circuit 200 FIG. 2 using the same trans-conductance or act at the same speed using a much smaller transconductance.

In an embodiment, a value of the reference voltage $V_{REF}$ is between 0 and 3.3V. In an embodiment, the load circuit 320 is capacitive with an input capacitance between 0.1 pF and 10 pF. In an embodiment, the capacitance of the shunt capacitor C is greater than that of the load circuit 320 by a factor between 10 and 1000. In an embodiment, the resistance of the resistor R is between 10 ohm and 1000 ohm. Note that the above mentioned figures for capacitance and resistance are all by way of example and should not be construed as limiting upon the claims.

In an embodiment, the whole buffer circuit 300 is fabricated in a CMOS (complementary metal-oxide semiconductor) integrated circuit. In an alternative embodiment, the whole buffer circuit 300 excluding the shunt capacitor is fabricated in a CMOS (complementary metal-oxide semiconductor) integrated circuit, and the shunt capacitor is an external device off the CMOS integrated circuit.

Various embodiments or implementations of switch circuit and OTA are well known in prior art and thus not described in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
    an OTA (operational trans-conductance amplifier) having a positive input terminal coupled to a reference voltage, a negative input terminal coupled to a feedback node, and an output terminal shunt to a ground node via a shunt capacitor;
    a resistor coupling the output terminal of the OTA to the feedback node; and
    a load circuit coupled to the feedback node via a switch directly connected to the feedback node controlled by a logical
    signal, wherein: an impedance of the shunt capacitor is substantially smaller than an input impedance of the load circuit.

2. The apparatus of claim 1, wherein: the load circuit is a switch capacitor circuit.

3. The apparatus of claim 1, wherein: a first current flowing through the resistor leads to a voltage difference between the output terminal of the OTA and the feedback node, and the voltage difference leads to a feedback from the feedback node via the negative input terminal of the OTA causing the OTA to output a second current to the shunt capacitor such that the second current is approximately equal to the first current.

4. The apparatus of claim 1, wherein the reference voltage is between 3.3V and 0V.

5. The apparatus of claim 1, wherein an input capacitance of the load circuit is between 0.1 pF and 10 pF.

6. The apparatus of claim 1, wherein a capacitance of the shunt capacitor is greater than an input capacitance of the load circuit by a factor between 10 and 1000.

7. The apparatus of claim 1, wherein the resistor is between 10 ohm and 1000 ohm.

8. The apparatus of claim 1, wherein the apparatus is fully fabricated in a CMOS (complementary metal-oxide semiconductor) integrated circuit.

9. The apparatus of claim 1, the apparatus excluding the shunt capacitor is fully fabricated in a CMOS (complementary metal-oxide semiconductor) integrated circuit, and the shunt capacitor is an external device off the CMOS integrated circuit.

10. The apparatus of claim 1, wherein the load circuit is a part of a pipeline ADC (analog-digital converter).

11. A method comprising:
    using an OTA (operational trans-conductance amplifier) to output a first current to a shunt capacitor, wherein the first current is substantially proportional to a voltage difference between a reference node and a feedback node;

coupling the feedback node to a load circuit via a switch directly connected to the feedback node controlled by a logical signal; and coupling the shunt capacitor to the feedback node via a resistor such that a second current flowing through the resistor is approximately equal to the first current.

12. The method of claim 11, wherein: the load circuit is a switch capacitor circuit.

13. The method of claim 11, wherein: a positive terminal of the OTA is coupled to the reference node, a negative terminal of the OTA is coupled to the feedback node, and an output terminal of the OTA is coupled to the shunt capacitor.

14. The method of claim 11, wherein the reference voltage is between 3.3V and 0V.

15. The method of claim 11, wherein an input capacitance of the load circuit is between 0.1 pF and 10 pF.

16. The method of claim 11, wherein a capacitance of the shunt capacitor is greater than an input capacitance of the load circuit by a factor between 10 and 1000.

17. The method of claim 11, wherein the resistor is between 10 ohm and 1000 ohm.

18. The method of claim 11 further comprising fabricating the OTA, the shunt capacitor, the resistor, the switch, and the load circuit in a CMOS (complementary metal-oxide semiconductor) integrated circuit.

19. The method of claim 11 further comprising fabricating the OTA, the shunt capacitor, the resistor, the switch, and the load circuit in a CMOS (complementary metal-oxide semiconductor) integrated circuit, wherein the shunt capacitor is an external device off the CMOS integrated circuit.

20. The method of claim 11, wherein the load circuit is a part of a pipeline ADC (analog-digital converter).

* * * * *